United States Patent [19]
Reddy, III

[11] Patent Number: 5,159,276
[45] Date of Patent: Oct. 27, 1992

[54] CAPACITANCE MEASURING CIRCUIT AND METHOD FOR LIQUID LEAK DETECTION BY MEASURING CHARGING TIME

[75] Inventor: William J. Reddy, III, Scottsdale, Ariz.

[73] Assignee: W. L. Gore & Associates, Inc., Newark, Del.

[21] Appl. No.: 726,479

[22] Filed: Jul. 8, 1991

[51] Int. Cl.$^5$ .............. G01R 27/26; G01R 31/02; G01R 31/08; H02G 15/28

[52] U.S. Cl. .................. 324/678; 324/512; 324/539; 324/557; 174/11 R; 340/605

[58] Field of Search ............... 324/519, 539, 555, 603, 324/663, 676, 677, 678, 679, 686; 174/11 R; 340/605

[56] References Cited

U.S. PATENT DOCUMENTS

| | | | |
|---|---|---|---|
| 3,452,272 | 6/1969 | Collins et al. | 324/519 |
| 3,581,196 | 5/1971 | Spaid | 324/678 |
| 3,761,805 | 9/1973 | Dornberger | 324/677 |
| 4,032,841 | 6/1977 | Knippelmeir | 324/678 |
| 4,095,174 | 6/1978 | Ishido | 174/11 R |
| 4,103,225 | 7/1978 | Stephens | 324/678 |
| 4,206,402 | 6/1980 | Ishido | 324/663 |
| 4,243,933 | 1/1981 | Rollman | 324/678 |
| 4,361,799 | 11/1982 | Lutz | 324/519 |
| 4,372,693 | 2/1983 | Lutz | 324/519 |
| 4,487,057 | 12/1984 | Lutz | 324/519 |
| 4,825,147 | 4/1989 | Cook | 324/678 |
| 4,877,923 | 10/1989 | Sahakian | 174/11 R X |

*Primary Examiner*—Gerard R. Strecker
*Assistant Examiner*—Diep Do
*Attorney, Agent, or Firm*—Gary A. Samuels

[57] ABSTRACT

A leak detection system and method are disclosed. The capacitance of a leak detection cable is changed by a leaking liquid. A capacitance measuring circuit detects changes in the capacitance of the cable and thereby detects the presence of a leak. The capacitance measuring circuit includes an inverter, a current source, a comparator, and a timer. The inverter inverts a DC voltage to produce a mirror-image invented DC voltage. The current source produces a constant current proportional to the mirror image inverted DC voltage and supplies the constant current to the cable such that the cable is charged. A comparator compares the voltage across the cable to the input voltage and produces a match signal when they are equal. A timer which is responsive to the match signal measures the time required for the cable to be charged. The capacitance of the cable is directly proportional to the charge time.

20 Claims, 5 Drawing Sheets

CAPACITANCE MEASURING CIRCUIT AND METHOD FOR LIQUID LEAK DETECTION BY MEASURING CHARGING TIME

BACKGROUND OF THE INVENTION

1. Field of the Invention

This invention relates generally to the field of leak detection, wherein a leaking fluid causes an impedance change in a sensing cable and the impedance change is detected as an indication of the leak.

2. Related Art

A variety of chemicals (e.g., oils, crude oil, refined petroleum products, gasoline, kerosene, organic solvents, and the like) are stored in underground tanks and transported through buried pipelines. Leakage from these tanks and pipelines can contaminate ground water and cause extensive environmental damage. Further, leaks are difficult to detect and often are not detected until extensive environmental damage has already occurred.

One method of detection has been to run a cable adjacent to the underground pipeline or tank. The cable includes a pair of conductors (e.g., coaxial or twin lead) with a permeable insulation disposed therebetween. If a leak occurs, the chemical will permeate the insulation and will cause a change in its dielectric properties such that the electrical characteristics between the conductors is changed. This will result in an impedance change that can be sensed at a remote end of the cable.

A common means for performing such sensing is time domain refelectometry (TDR) wherein an electrical pulse is propagated down the cable and any reflections are received and observed. An additional means which may be used is capacitance measuring.

Capacitance measuring has been used to locate faults in electrical communication cables. If the measured capacitance of a cable is compared with a known distributed capacitance per unit length for that cable, the length of the cable or the location of an open fault (i.e., a break) may be determined. In a similar manner, capacitance measuring could be used to sense a change in the capacitance of a cable due to permeation of a liquid chemical.

A known means for measuring capacitance is to charge a cable with a constant current to a predetermined voltage and to measure the charge time. The charge time can then be related to the value of the unknown capacitance. U.S. Pat. No. 3,452,272 to Collins et al., U.S. Pat. No. 3,761,805 to Dornberger, and U.S. Pat. No. 4,103,225 to Stephens provide examples of constant current capacitance measuring systems.

While these systems may be relatively simple, they tend to yield poor accuracy (i.e., the systems suffer from measurement error) and/or require frequent calibration. A substantial amount of error is caused by variations in the constant charging current, which is caused by variations in the power supply voltage and variations in circuit component values.

SUMMARY OF THE INVENTION

The present invention is a method and system for leak detection. The capacitance of a leak detection cable is changed by a leaking liquid. A capacitance measuring circuit detects changes in the capacitance of the cable and thereby detects the presence of a leak.

The capacitance measuring circuit includes an inverter, a current source, a comparator, and a timer. The inverter inverts a DC voltage to produce a mirror-image inverted DC voltage. The current source produces a constant current proportional to the mirror-image inverted DC voltage and supplies the constant current to the cable so that the cable is charged from a first potential to a second potential. A comparator compares the voltage across the cable to the input voltage and produces a match signal when a predetermined relationship exists therebetween. A timer responsive to the match signal measures the time required for the cable to be charged from the first potential to the second potential. The capacitance of the cable is directly proportional to the charge time.

In the preferred embodiment a switch connected in parallel with the cable shunts the constant current to ground such that the first potential is zero volts. A controller controls the switch and the timer such that the switch is caused to open and the timer is caused to begin counting simultaneously.

It is an advantage of the present invention that voltage related errors are eliminated from the capacitance measuring circuit such that the need for calibration is eliminated.

It is another advantage of the invention that an accurate and stable capacitive measuring circuit is disclosed which is simple and contains relatively few parts.

PREFERRED EMBODMENT OF THE PRESENT INVENTION

Figure 1:
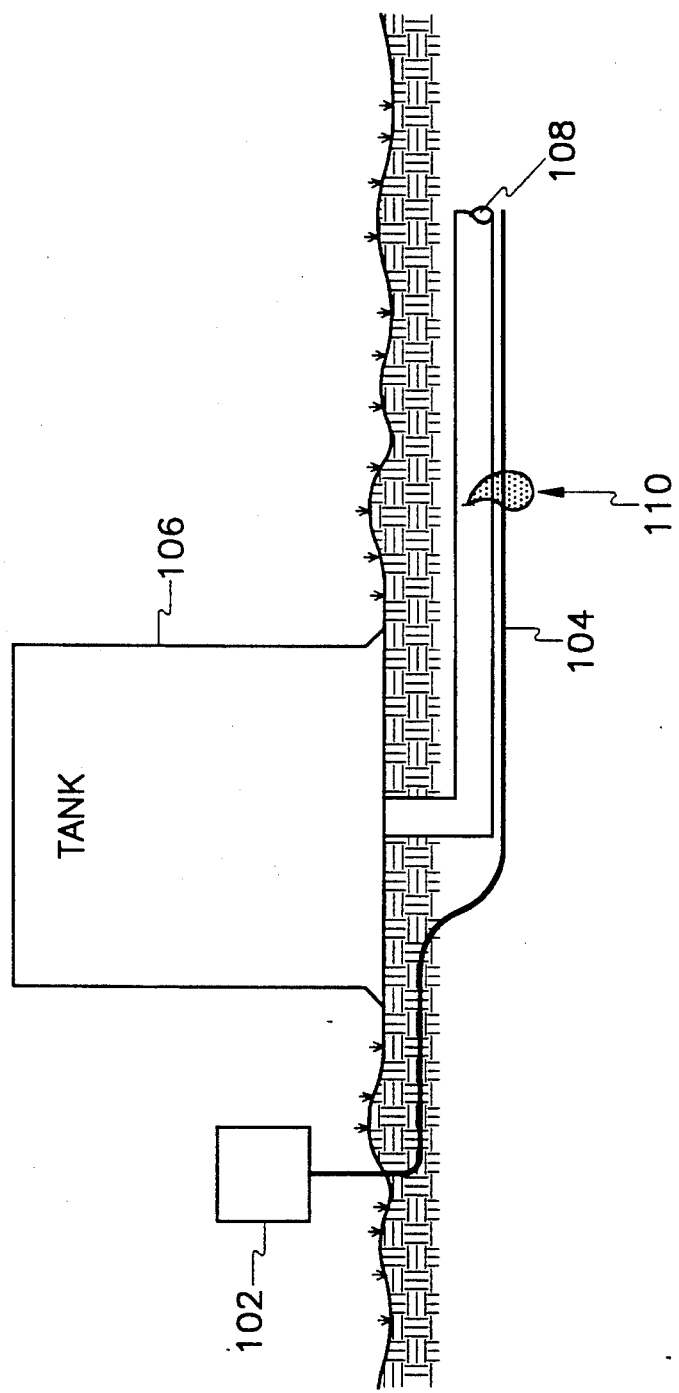
FIG. 1 is a diagram showing the leak detection system of the present invention.

A leak detection system 100 is shown in FIG. 1 in the environment of a storage tank 106 and a pipeline 108. System 100 includes a capacitance measuring circuit 102 and a leak detection cable 104. Storage tank 106 and pipeline 108 contain a chemical (e.g., fuel oil) for which leak detection is desired. Cable 104 is laid adjacent tank 106 and pipeline 108. One end of cable 104 is connected to capacitive measuring circuit 102. The other end of cable 104 remains unterminated.

Leak detection cable 104 is a conventional leak detection cable as is known in the art. The specific cable chosen will depend on the properties of the liquid to be detected. In the preferred embodiment, a cable may be used such as that disclosed in U.S. Pat. No. 4,877,923 to Sahakian and available as part number LLF-0126 (water and liquid chemical cable) or LLF-0118 (hydrocarbon cable) from W. L. Gore & Associates, Inc., Wilmington, Del. Examples of other leak detection cables are disclosed in U.S. Pat. Nos. 3,981,181 to Ochiai, 4,029,889 to Mizuochi, 4,206,632 to Suzuki, 4,594,638 to Suzuki, and, 4,910,998 to Willis et al.

Figure 2A:
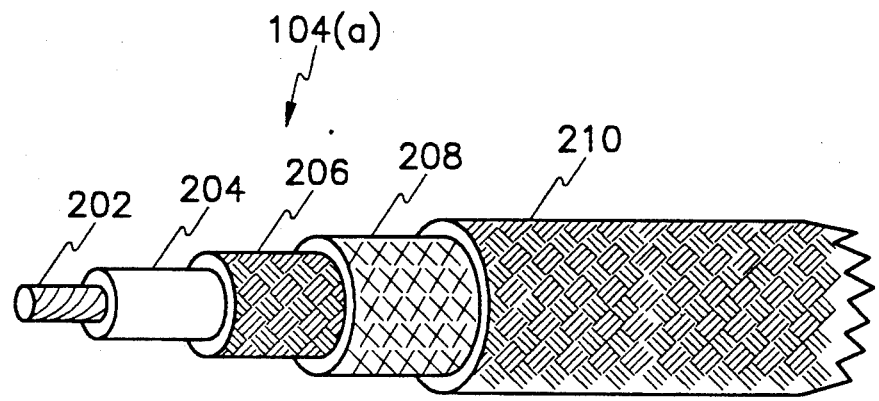
FIGS. 2(a) and (b) show cutaway perspective views of two embodiments of leak detection cable 104.

A first embodiment 104(a) of cable 104 is shown in detail in FIG. 2(a). This embodiment can be used for detecting water as well as liquid chemicals. Cable 104(a) includes an inner conductor 202, a first insulation layer 204, a second insulation layer 206, a coaxial outer conductor 208, and an outer protective layer 210.

First insulation layer 204 is a hydrophobic, microporous insulation such as expanded, micro-porous polytetrafluoroethylene (EPTFE). Second insulation layer 206 is a polyester braided filler which is permeable so as to pass chemicals, but is not hydrophobic. Outer conductor 208 is of braided conductive metal construction and is fluid permeable. Protective layer 210 is a permeable material such as polyethylene or polyester and can be woven or braided.

Figure 2B:
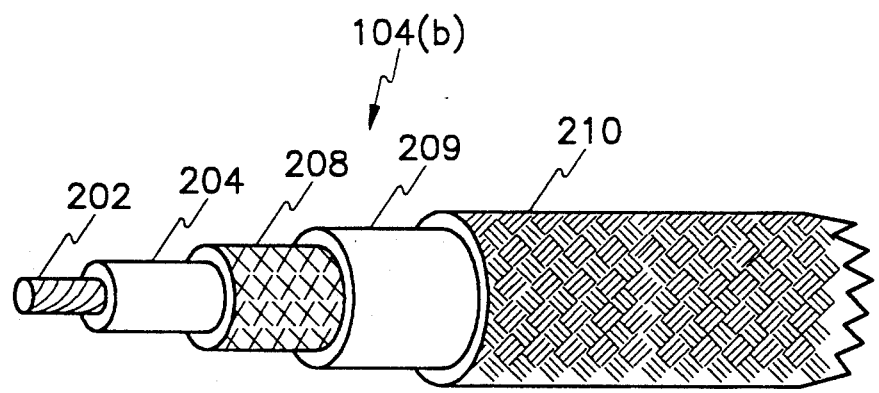

A second embodiment 104(b) of cable 104 is shown in detail in FIG. 2(b). This embodiment can be used for detecting liquid hydrocarbons. Cable 104(b) includes an inner conductor 202, a first insulation layer 204, a coaxial outer conductor 208, an outer hydrophobic layer 209, and an outer protective layer 210.

First insulation layer 204 and hydrophobic layer 209 are both hydrophobic, micro-porous insulation such as EPTFE. Outer conductor 208 is of braided conductive metal construction and is fluid permeable. Protective layer 210 is a permeable material such as polyethylene or polyester and can be woven or braided.

Note that cable 104(a) may be used to sense a variety of liquids (including water), while cable 104(b) is limited to liquids which are capable of permeating hydrophobic layer 209 (e.g., hydrocarbons). The operative difference between the cables is hydrophobic layer 209 of cable 104(b) which prevents water from reaching the conductors such that the impedance of cable 104(b) will not be affected by water. Cable 104(a), on the other hand, allows water to be absorbed into second insulation layer 206 between the conductors such that water can be detected.

Referring now to FIGS. 1 and 2(a), operation of leak detection system 100 is described. If a leak (e.g., leak 110) occurs in tank 106 or pipe 108, the leaking liquid will eventually come into contact with cable 104. In the case of cable 104(a), the liquid will pass through protective layer 210 and conductor 208, and will be absorbed into first insulation layer 204 and second insulation layer 206. The absorbed liquid will cause a change in the dielectric properties of insulation layers 204 and 206. This will result in a change in the capacitance of the cable which can be sensed by capacitance measuring circuit 102 at a remote end of the cable.

In the case of cable 104(b), shown in FIG. 2(b), the liquid will pass through protective layer 210 and contact hydrophobic layer 209. Only hydrocarbons will pass through layer 209 (i.e., water will be excluded). The hydrocarbon will then pass through outer conductor 208 and will be absorbed into first insulation 204. As with cable 104(a), the absorbed liquid will cause a change in the dielectric properties of insulation layer 204, resulting in a corresponding change in the capacitance of the cable which can be sensed by capacitance measuring circuit 102.

Figure 3:
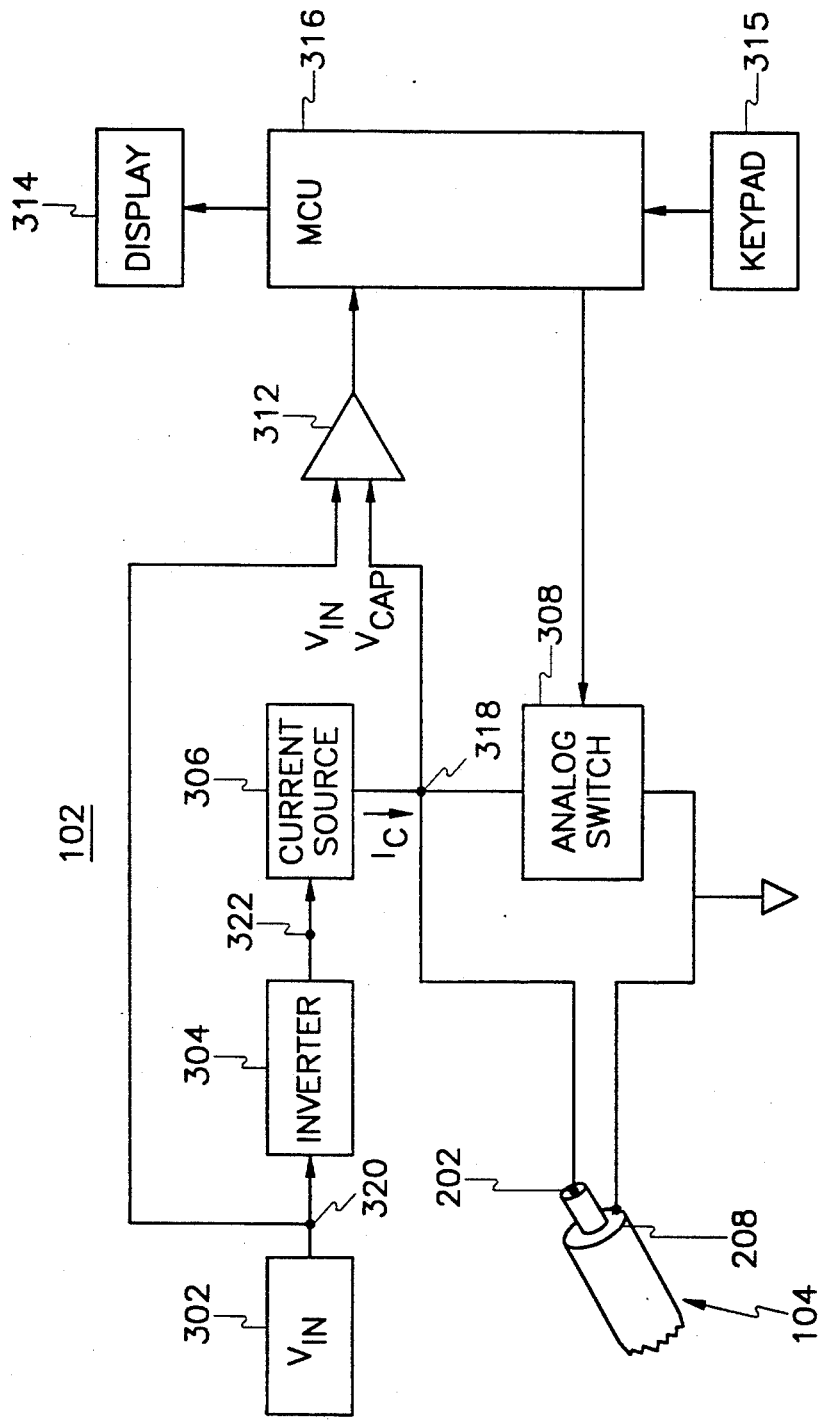
FIG. 3 is a block diagram of capacitance measuring circuit 102 of the present invention.

Capacitance measuring circuit 102 is shown in FIG. 3. A voltage source 302 provides a stable DC voltage ($V_{IN}$) to a first input of a comparator circuit 312 and to an input (terminal 320) of inverter circuit 304. Inverter circuit 304 inverts $V_{IN}$ from voltage source 302 and provides a mirror-image inverted DC voltage ($-V_{IN}$) to an input (terminal 322) of a constant current source 306. Current source 306 has an output terminal 318.

Cable 104, having a capacitance $C_x$ which is to be measured, is connected between terminal 318 and ground. Inner conductor 202 of cable 104 is connected to terminal 318 while outer conductor 208 is tied to ground. Current source 306 provides a constant DC charging current ($I_c$) to cable 104. A digitally controlled, analog switch 308 is connected in shunt fashion across cable 104 (i.e., between terminal 318 and ground). Terminal 318 is also connected to a second input of comparator circuit 312. The output of comparator circuit 312 is input to a microcontroller unit (MCU) 316. MCU 316 provides an output signal to a display unit 314, and a control signal to digitally controlled analog switch 308. A keypad 315 is provided as a user-interface to MCU 316.

Figure 4:
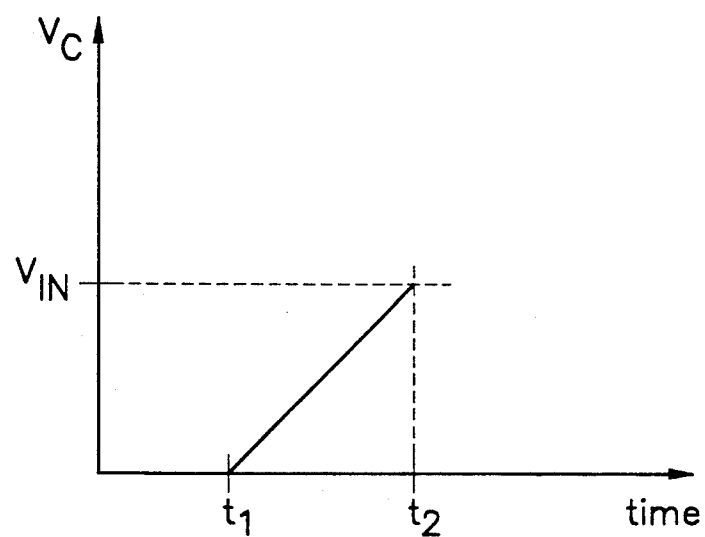
FIG. 4 is a graphical representation of the charging voltage and time for cable 104.

The principle of operation of capacitance measuring circuit 102 is now described with reference to FIGS. 3 and 4. Initially, switch 308 is CLOSED. In this position, switch 308 shorts terminal 318 to ground such that the net voltage between conductors 202 and 208 of cable 104 is zero. Output current $I_c$ from output terminal 318 is shunted to ground through switch 308.

At a time $t_1$, MCU 316 causes switch 308 to toggle OPEN. $I_C$ then loses its direct path to ground through switch 308 and is forced to flow through cable 104. This causes the cable to be charged.

As a result of the charging, a net voltage $V_C$ is developed between the conductors of cable 104. Comparator circuit 312 continuously compares $V_C$ (as seen at terminal 318) to $V_{IN}$. At a time $t_2$, $V_C$ becomes equal to $V_{IN}$, causing comparator circuit 312 to toggle and send a match signal to MCU 316 indicating that $V_C$ has reached the desired level. MCU 316 then computes a time $\Delta t = t_2 - t_1$. Time $\Delta t$ is directly proportional to a capacitance value $C_X$ of cable 104.

The relationship between $\Delta t$ and $C_X$ can be defined mathematically as follows. For a capacitor being charged by a constant current:

$$\Delta V = \frac{I \times \Delta t}{C} \quad \text{(Equation 1)}$$

where:
  $\Delta V$ = voltage change across capacitor
  I = constant charging current
  $\Delta t$ = charge time
  C = capacitance Substituting the circuit variables discussed above into this generic equation yields.

$$\Delta V_C = \frac{I_C \times \Delta t}{C_X} \quad \text{(Equation 2)}$$

The formula for current $I_c$ from current source 306 is set forth in Equation 8 below. If Equation 8 is substituted into Equation 2 and Equation 2 is solved for $C_X$, the following results:

$$C_X = \frac{V_{IN}}{\Delta V_C} \times \frac{R4}{R3 \times R7} \times \Delta t \quad \text{(Equation 3)}$$

This equation can be further simplified. Since the initial charge on cable 104 at time $t_1$ is zero volts, $\Delta V_c$ will be equal to $V_c$. Also, comparator circuit 312 will trip when $V_C = V_{IN}$. Therefore, $V_{IN}$ can be substituted for $\Delta V_C$ such that Equation 3 can be simplified to:

$$C_X = K \times \Delta t \quad \text{(Equation 4)}$$

where: $K$ = constant

-continued
$$= R4/(R3 \cdot R7)$$

Thus, the value of the unknown capacitance $C_X$ is directly proportional to the charge time ($\Delta t$), and is independent of $V_{IN}$.

Again, Equation 4 illustrates that the measured value $C_X$ of cable 104 is independent of $V_{IN}$. This eliminates voltage related errors from circuit 102, and eliminates the need for calibration. The result is an accurate and stable capacitive measuring apparatus which is simple and contains relatively few parts.

After determining the value of capacitance $C_X$, MCU 316 will compare the measured value of $C_X$ to a range of predetermined acceptable limits. If the value of $C_X$ does not fall within the range of acceptable limits, then MCU 316 may generate an alarm signal indicating a leak or broken cable condition. Keypad 315 and display 314 provide a user interface to MCU 316.

Figure 5:
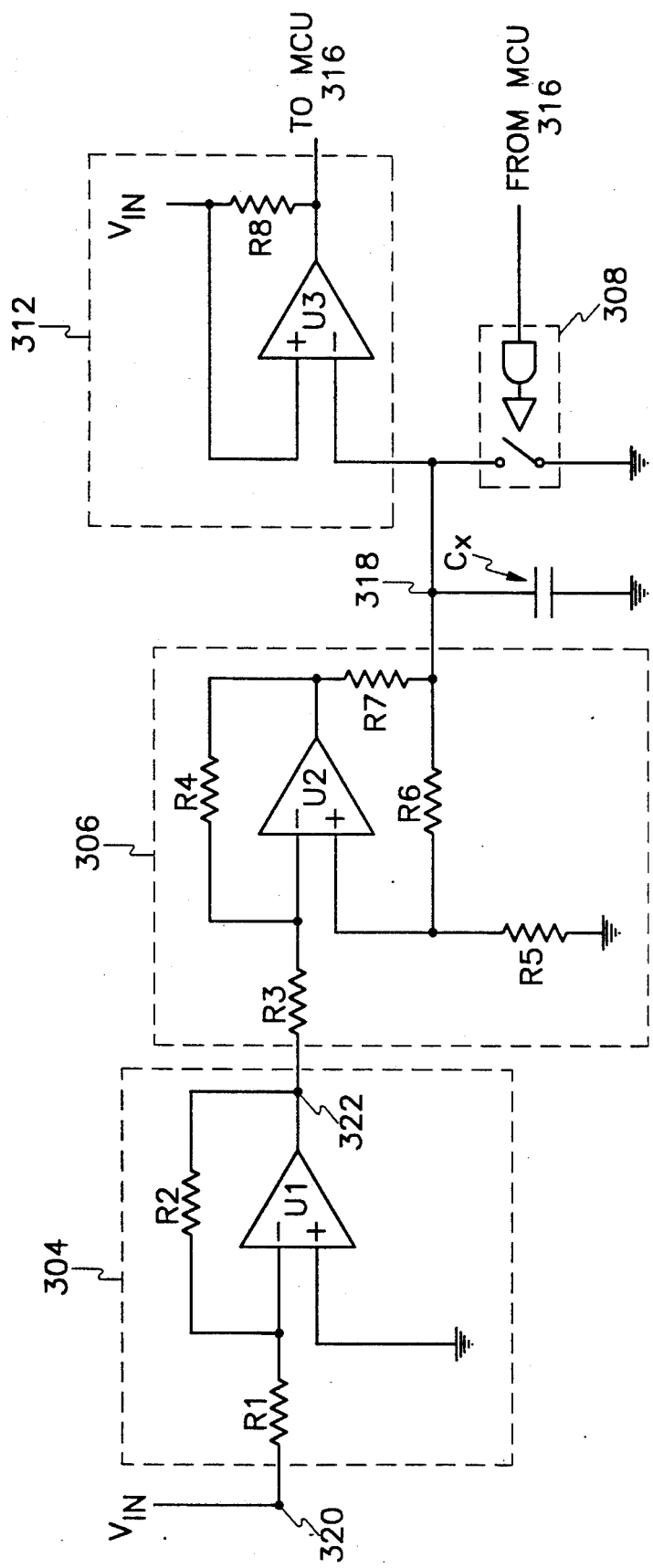
FIG. 5 is a partial schematic diagram detailing capacitance measuring circuit 102.

FIG. 5 is a schematic diagram of inverter 304, current source 306, comparator circuit 312, and switch 308 of capacitance measuring circuit 102. Inverter 304 includes a resistor R1, a resistor R2, and an operational amplifier U1. U1, R1 and R2 are connected in an inverting amplifier configuration with R1 connected between terminal 320 and the inverting input of U1. Resistor R2 is connected between the inverting input and the output (terminal 322) of U1. The non-inverting input of U1 is connected to ground.

For an ideal operation amplifier (U1), inverter 304 produces an output voltage at terminal 322 defined by the following equation.

For R1=R2, the equation simplifies to:

$$V_{322} = -V_{IN} \times \frac{R2}{R1} \quad \text{(Equation 5)}$$

$$V_{322} = -V_{IN} \quad \text{(Equation 6)}$$

The output voltage of inverter 304 is fed to the input of current source 306. Current source 306 includes operation amplifier U2, and resistors R3-R7. The voltage at terminal 322 ($-V_{IN}$) is fed to the inverting input of U2 through R3. R4 provides feedback from the output of U2 to the inverting input of U2. The non-inverting input of U2 is connected to ground through R5. R7 is connected between the output of U2 and output terminal 318. R6 is connected between output terminal 318 and the non-inverting input of U2.

For an ideal operation amplifier (U2), current source 306 produces an output current defined by the following equation:

$$I_C = -V_{322} \times \frac{R4}{R3 \times R7} \quad \text{(Equation 7)}$$

Substituting Equation 6 into Equation 7 yields:

$$I_C = V_{IN} \times \frac{R4}{R3 \times R7} \quad \text{(Equation 8)}$$

Cable 104 is represented as a capacitance $C_X$ connected from output terminal 318 to ground. Comparator circuit 312 monitors the voltage at terminal 318. Comparator circuit 312 includes comparator U3 and resistor R8. The non-inverting input of U3 is connected to $V_{IN}$. R8 is connected from the output terminal of U3 to the non-inverting input of the same. The inverting input of U3 is connected to terminal 318. The output of comparator circuit 312 is connected to MCU 316.

Note that the mirror-image inverted input voltage $-V_{IN}$ is the opposite of the input voltage $V_{IN}$. As $V_{IN}$ varies, $-V_{IN}$, and correspondingly $I_C$, will vary an equal amount in the opposite direction. The consequence of this, as set forth in the mathematical equations discussed above, is that any variation in $V_{IN}$ as seen at comparator circuit 312 will be negated by an equal and opposite variation in $V_C$ (as carried through $-V_{IN}$ and $I_C$). Thus, voltage supply related errors are eliminated.

The only error sources remaining in the circuit are the non-ideal characteristics of the circuit components. These include leakage and bias currents of operational amplifiers U1 and U2, propagation delays through the circuit, and resistor value variations. Each of these variables comprises an initial tolerance (e.g., initial deviation from ideal), a temperature variation, and an end-of-life variation (i.e., aging). The effects of initial tolerances may be eliminated by "trimming" circuit 102 during a one time calibration at manufacture.

This leaves component variations due to temperature and end-of-life as the only remaining potential source of errors. Component variations due to temperature and aging, however, are easily minimized by using precision components.

In the preferred embodiment of the invention, the following components would be utilized in circuit 102. U1 and U2 are MC33282P operational amplifiers from Motorola Semiconductor Products, Inc., Phoenix, Ariz. Voltage comparator U3 is available from Texas Instruments Incorporated, Dallas, Tex., as part number LC372IP. MCU 316 is an MC68HC811E2FN microcontroller, also from Motorola. Digitally controlled analog switch 308 is available from Siliconix Incorporated, Santa Clara, Calif., as part number DG401AK. Alternatively, switch 308 may be a transistor.

Display 314 is a 2×16 Dot Matrix LCD (Liquid Crystal Display), part number L1642 from Seiko Instruments USA, Inc., Torrance, Calif. Keypad 315 is a one by four membrane keypad available from W.H. Brady Company, Xymox Division, Milwaukee, Wis., under part number 2012084. $V_{IN}$ is a +5 Volt DC voltage. Resistors R1-R8 are 1% tolerance, carbon composition resistors having the following values:

| Resistor | Value |
| --- | --- |
| R1 | 1 MΩ |
| R2 | 1 MΩ |
| R3 | 2 MΩ |
| R4 | 1 MΩ |
| R5 | 2 MΩ |
| R6 | 500 KΩ |
| R7 | 500 KΩ |
| R8 | 5.1 KΩ |

The output of comparator 312 is tied to an edge-sensitive input capture pin PA2 (pin 32) of MCU 316. The armature of switch 308 is controlled by pin PC3 (pin 12) of MCU 316. PC3 (pin 12) of MCU 316 is also connected to an edge-sensitive input capture pin PA1 (pin 33) of MCU 316.

Substituting the above resistor values into Equations 4 and 8 yields the following:

$$C_X = \frac{1M\Omega}{2M\Omega \times 500K\Omega} \times \Delta t$$

$$= 10^{-6} \times \Delta t$$

$$= 1 \frac{\mu F}{sec} \times \Delta t \text{ sec}$$

$$I_C = 5V \times \frac{1M\Omega}{2M\Omega \times 500K\Omega}$$

$$= 5 \mu A$$

For fuel oil leak detection, operation of leak detection system 100 would be as follows. Assuming that cable 104 is 100 feet in length and has a distributed capacitance of 23 pF/foot, then the nominal or reference capacitance ($C_{REF}$) measured by circuit 102 will be 2300 pF (e.g. corresponding to a charge time of 2300 μsec). Given that fuel oil will change the capacitance of cable 104 by 12 pF/foot, and that it is desired to indicate a leak when at least two feet of cable 104 are in contact with leaking oil, then MCU 316 may be programmed to sound an alarm when the capacitance of the cable exceeds a predetermined leak detection threshold (LDT). Similarly, a break in the cable may be sensed as a decrease in the capacitance of the line, and an alarm sounded when the capacitance falls below a predetermined cable break threshold (CBT).

The predetermined thresholds (i.e., LDT and CBT) may be determined in accordance with the following considerations. A capacitance change of approximately ±5 pF has been found to be a suitable threshold for a cable 230 feet long. As the cable length is increased, however, each threshold should be adjusted to account for variation of the cable capacitance due to temperature. With shorter cable lengths (e.g., ≦230 feet), temperature effects are small and may be ignored. As the length of a cable is increased, however, the per foot capacitance change per degree (i.e., pF/(foot·degree)) has an increasing effect, and should not be ignored.

Accordingly, in the preferred embodiment, the thresholds are determined by the following equations:

$$LDT = C_{REF} + INT\left(\frac{C_{REF}}{230}\right) + 5$$

$$CBT = C_{REF} - INT\left(\frac{C_{REF}}{230}\right) + 5$$

where:

$C_{REF}$ = the nominal or reference capacitance of the cable

INT = a function which takes the next highest integer value

Examples of several cable lengths for a 23 pF/foot cable which exhibits a 12 pF/foot change in impedance when contacted by the leaking liquid are listed below in Table I. LDT and CBT were calculated according to the equations listed above. $L_{WET}$ represents the length of cable which must contact the leaking liquid in order to exceed the LDT. $L_{CUT}$ represents the length of a portion of cable which must be cut in order to fall below the CBT.

TABLE I

| CABLE LENGTH | $C_{REF}$ | LDT | CBT | $L_{WET}$ | $L_{CUT}$ |
|---|---|---|---|---|---|
| 1000' | 23,000 pF | 23,105 | 22,895 | 8.75' | 4.6' |
| 100' | 2,300 pF | 2,315 | 2,285 | 1.25' | .65' |
| 10' | 230 pF | 236 | 224 | .50' | .26' |
| 1' | 23 pF | 28 | 18 | .42' | .22' |

In this preferred embodiment, a current limit resistor may be placed between terminal 318 and capacitance $C_X$ in series connection to meet Underwriter's Laboratories intrinsic safety requirements for electrical apparatus for monitoring in hazardous locations. A wirewound 120 Ω, 3 Watt resistor is used in the preferred embodiment. This resistor will limit the current that can be drawn by cable 104 in the event of an internal short-circuit failure of circuit 102. Because $I_C$ is a very small current, only a negligible voltage drop will occur across this resistor, such that no significant measurement error will be introduced.

Once a leak or a break in the cable is sensed using the apparatus and method of the present invention, known time domain reflectometry (TDR) techniques may be used to precisely locate the position of the leak or break along the cable, if desired.

It should be understood that capacitance measuring circuit 102 can be used with any length of cable. It should be further understood, that capacitance measuring circuit 102 has many applications in addition to that of leak detection. For example, circuit 102 could be used as a general purpose capacitance measuring circuit.

Although the invention has been described and illustrated with a certain degree of particularity, it is understood that those skilled in the art will recognize a variety of additional applications and appropriate modifications within the spirit of the invention and the scope of the claims.

What is claimed is:

1. A capacitance measuring circuit for use with a leak detection cable, said circuit comprising:
    (a) inverter means for receiving a DC input voltage and for inverting said DC input voltage to produce a mirror-image inverter DC voltage;
    (b) current source means for receiving a DC voltage ($V_X$) and for producing a constant current ($I_C$) proportional to said DC voltage ($V_X$), said constant current ($I_C$) being defined by the equation $I_C = -k \cdot V_X$, where k is equal to a predetermined constant, and where $V_X$ is equal to one of said DC input voltage and said mirror-image inverted DC voltage;
    (c) means for supplying said constant current ($I_C$) to the leak detection cable such that the leak detection cable is charged from a first potential to a second potential;
    (d) comparator means for comparing said second potential to the other one of said DC input voltage and said mirror-image inverted DC voltage and for producing a match signal when a predetermined relationship exists therebetween; and
    (e) timer means responsive to said match signal for measuring a time required for the leak detection cable to be charged from said first potential to said second potential.

2. The capacitance measuring circuit of claim 1, further comprising:

(f) switch means connected in parallel with the leak detection cable for shunting said constant current to ground such that said first potential is zero volts.

3. The capacitance measuring circuit of claim 2, further comprising:
 (g) a microcontroller means for controlling said switch means and said timer means such that said switch means is caused to open and said timer means is caused to begin counting simultaneously.

4. The capacitance measuring circuit of claim 3, wherein said predetermined relationship is equality.

5. An apparatus for measuring a capacitance, the apparatus comprising:
 (a) inverter means for receiving a DC input voltage and for inverting said DC input voltage to produce a mirror-image inverted DC voltage;
 (b) current source means for receiving a DC voltage ($V_x$) and for producing a constant current ($I_c$) proportional to said DC voltage ($V_x$), said constant current ($I_c$) being defined by the equation $I_c = -k \cdot V_x$, where k is equal to a predetermined constant, and where $V_x$ is equal to one of said DC input voltage and said mirror-image inverted DC voltage;
 (c) means for supplying said constant current ($I_c$) to the capacitance such that the capacitance is charged from a first potential to a second potential;
 (d) comparator means for comparing said second potential to the other one of said DC input voltage and said mirror-image inverted DC voltage and for producing a match signal when a predetermined relationship exists therebetween; and
 (e) timer means responsive to said match signal for measuring a time required for the capacitance to be charged from said first potential to said second potential.

6. The apparatus of claim 5, further comprising:
 (f) switch means connected in parallel with the capacitance for shunting said constant current to ground such that said first potential is zero volts.

7. The apparatus of claim 6, further comprising:
 (g) microcontroller means for controlling said switch means and said timer means such that said switch means is caused to open and said timer means is caused to begin counting simultaneously.

8. The apparatus set forth in claim 7, wherein said predetermined relationship is equality.

9. A system for detecting leakage of a liquid, said system comprising:
 (a) a leak detection cable having two substantially parallel conductors with a permeable insulator disposed therebetween; and
 (b) a capacitance measuring circuit connected to a first end of said cable, said circuit including:
  (i) inverter means for inverting a DC voltage ($V_{IN}$) to produce a mirror-image inverted DC voltage ($-V_{IN}$);
  (ii) current source means for producing a constant current ($I_c$) proportional to said mirror-image inverted DC voltage ($-V_{IN}$), $I_c$ being defined by the equation $I_c = k \cdot V_{IN}$, where k is equal to a predetermined constant;
  (iii) means for supplying said constant current ($I_c$) to said cable such that said cable is charged from a first potential to a second potential;
  (iv) comparator means for comparing said second potential to said DC voltage ($V_{IN}$) and for producing a match signal when a predetermined relationship exists therebetween; and
  (v) timer means responsive to said match signal for measuring a time required for said cable to be charged from said frist potential to said second potential.

10. The system of claim 9, wherein said capacitance measuring circuit further comprises:
 (vi) switch means connected in shunt fashion between said conductors of said cable such that said first potential is zero volts.

11. The system of claim 10, wherein said capacitance measuring circuit further comprises:
 (vii) microcontroller means for controlling said switch means and said timer means such that said switch means is caused to open and said timer means is caused to begin counting simultaneously.

12. The system of claim 11, wherein the leak detection cable is a coaxial cable comprising:
 an inner conductor;
 an outer conductor of braided metal construction formed in a hollow tubular configuration, said outer conductor being disposed concentrically with said inner conductor such that said inner conductor passes through a hollow central portion of said outer conductor; and
 a permeable insulation layer concentrically disposed between said inner conductor and said outer conductor.

13. The system of claim 12, wherein said permeable insulator of said leak detection cable is hydrophobic, micro-porous, expanded, polytetrafluoroethylene (EPTFE).

14. A capacitance measuring circuit for use with a leak detection cable having two substantially parallel conductors with a permeable insulator disposed therebetween, said circuit comprising:
 (a) an inverter which produces an output voltage $-V_{IN}$ from an input voltage $V_{IN}$, wherein $-V_{IN}$ is a mirror-image of $V_{IN}$;
 (b) a current source, electrically connected to said inverter and to said leak detection cable, said current source accepting $-V_{IN}$ as input and outputting a constant current $I_C$ to the leak detection cable, wherein $I_C$ is defined by the equation $I_C = k \cdot V_{IN}$, and k is equal to a predetermined constant;
 (c) a voltage comparator having a first input and a second input, said first input being electrically connected to $V_{IN}$ and said second input being electrically connected to the leak detection cable, said voltage comparator comparing a voltage $V_X$ between the two substantially parallel conductors of the leak detection cable to $V_{IN}$ and producing a match signal when said voltage between the two substantially parallel conductors of the leak detection cable reaches $V_{IN}$;
 (d) a digitally controlled analog switch selectively having an OPEN position and a CLOSED position, said digitally controlled analog switch being electrically connected in parallel with the leak detection cable, wherein such that said constant current is shunted to ground and $V_X$ is substantially equal to zero when said digitally controlled analog switch is in said CLOSED position, and wherein said leak detection cable is charged by said constant current when said digitally controlled analog switch is in said OPEN position; and (e) a microcontroller unit having an internal timer, said microcontroller unit being electrically connected to said digitally controlled analog switch and to said voltage comparator such that said switch is controlled by said microcontroller unit and said internal timer is responsive to said match signal from said voltage comparator, wherein said switch is caused to OPEN and said internal timer is caused to start timing simultaneously, and wherein said internal timer is caused to stop timing in response to said match signal from said voltage comparator such that a time required for $V_X$ to be charged from zero to $V_{IN}$ is measured by said internal timer.

15. A method for measuring a capacitance value, said method comprising the steps of:
    (1) receiving a DC voltage;
    (2) inverting said DC voltage to produce a mirror-image inverted DC voltage;
    (3) producing a constant current which is proportional to one of said DC voltage and said mirror-image inverted DC voltage, said constant current being defined by the equation $I = -k \cdot V$, where I is equal to said constant current, k is equal to a predetermined constant, and V is equal to said one of said DC voltage and said mirror-image inverted DC voltage;
    (4) providing said constant current to the capacitance such that the capacitance is charged from a first potential to a second potential;
    (5) comparing said second potential to the other one of said DC voltage and said mirror-image inverted DC voltage;
    (6) generating a match signal when a predetermined relationship exists between said second potential and said other one of said DC voltage and said mirror-image inverted DC voltage;
    (7) measuring a time required for the capacitance to be charged from said first potential to said second potential as indicated by said match signal; and
    (8) determining the value of the capacitance from said time.

16. A method for monitoring a capacitance of a leak detection cable and for sounding an alarm signal when the capacitance is changed by permeation of a liquid into the leak detection cable, said method comprising the steps of:
    (1) receiving a DC voltage ($V_{IN}$);
    (2) inverting said DC voltage ($V_{IN}$) to produce a mirror-image inverted DC voltage ($-V_{IN}$);
    (3) producing a constant current ($I_C$) which is proportional to said mirror-image inverted DC voltage ($-V_{IN}$), $I_C$ being defined by the equation $I_C = k \cdot V_{IN}$, where k is equal to a predetermined constant;
    (4) providing said constant current ($I_C$) to the leak detection cable such that the leak detection cable is charged from a first potential to a second potential;
    (5) comparing said second potential to said DC voltage ($V_{IN}$);
    (6) generating a match signal when a predetermined relationship exists between said second potential and said DC voltage ($V_{IN}$);
    (7) measuring a time required for the leak detection cable to be charged from said first potential to said second potential as indicated by said match signal;
    (8) determining a value of the capacitance from said time;
    (9) comparing said value of the capacitance to a predetermined threshold; and
    (10) generating an alarm signal when said value of the capacitance exceeds said threshold.

17. The capacitance measuring circuit of claim 4, wherein said DC voltage ($V_X$) is equal to said mirror-image inverted DC voltage and wherein said comparator means compares said second potential to said DC input voltage.

18. The capacitance measuring circuit of claim 4, wherein said DC voltage ($V_X$) is equal to said DC input voltage and wherein said comparator means compares said second potential to said mirror-image inverted DC voltage.

19. The apparatus of claim 4, wherein said DC voltage ($V_X$) is equal to said mirror-image inverted DC voltage and wherein said comparator means compares said second potential to said DC input voltage.

20. The apparatus of claim 4, wherein said DC voltage ($V_X$) is equal to said DC input voltage and wherein said comparator means compares said second potential to said mirror-image inverted DC voltage.

* * * * *